United States Patent [19]
Mawhinney et al.

[11] 3,953,878
[45] Apr. 27, 1976

[54] CONSTANT TEMPERATURE CONTROL FOR TRANSFERRED ELECTRON DEVICES

[75] Inventors: Daniel David Mawhinney, Livingston; Thomas Edward Walsh, Kearny, both of N.J.

[73] Assignee: RCA Corporation, New York, N.Y.

[22] Filed: Mar. 12, 1975

[21] Appl. No.: 557,532

Related U.S. Application Data

[63] Continuation of Ser. No. 417,388, Nov. 19, 1973, abandoned.

[52] U.S. Cl. .................................. 357/81; 357/28; 330/5; 330/127
[51] Int. Cl.² ........................................ H01L 23/02
[58] Field of Search ............ 357/28, 81; 330/5, 127

[56] References Cited
UNITED STATES PATENTS

| | | |
|---|---|---|
| 3,490,051 | 1/1970 | Hakki et al. .......................... 330/5 |
| 3,644,839 | 2/1972 | Periman et al. ....................... 330/5 |
| 3,754,191 | 8/1973 | Acket et al. .......................... 330/5 |
| 3,768,029 | 10/1973 | Upadhyayula ....................... 330/127 |

*Primary Examiner*—Andrew J. James
*Attorney, Agent, or Firm*—Edward J. Norton; Robert L. Troike

[57] ABSTRACT

Two transferred electron devices are provided in a thermally coupled relationship. One transferred electron device is operated above threshold voltage as an amplifier or oscillator, while the other transferred electron device is operated below threshold voltage so as to supply heat to the first device, to compensate for any operating temperature changes and thereby maintain the first device at a substantially constant temperature.

7 Claims, 6 Drawing Figures

CONSTANT TEMPERATURE CONTROL FOR TRANSFERRED ELECTRON DEVICES

This is a continuation of application ser. no. 417,388, filed Nov. 19, 1973 and now abandoned.

BACKGROUND OF THE INVENTION

The present invention relates to a transferred electron device which can be operated at a constant temperature as ambient temperature varies. More specifically, the present invention relates to a transferred electron device with means for compensating variations in temperture.

In the past, changes in ambient or heat sink temperatures have had detrimental effects on the performance stability of transferred electron amplifiers and oscillators. Thermally induced changes in the bulk material of the active device often cause variations in power output or operating frequency and complications in the start-up or voltage breakdown of a transferred electron oscillator. As for the transferred electron amplifier, temperature changes cause problems in gain variations and loss of stabilization.

One means for solving problems caused by temperature changes was to place the transferred electron amplifier or oscillator in a temperature-controlled oven. However, this is practical in only a very few cases. When an oven can be used, there are still difficulties in that a tradeoff must be made in the design of the heat transfer medium between minimizing oven input power and the maximum temperature of the active device. When utilizing a low thermal conductivity medium, the oven power is conserved but the device temperature is higher which usually degrades performance and reliability of the electron transferred device.

SUMMARY OF THE INVENTION

A constant temperature device which includes two transferred electron devices. The transferred electron devices are thermally connected and one such device is biased above threshold voltage while the other is biased below threshold voltage.

DETAILED DESCRIPTION

Figure 1:
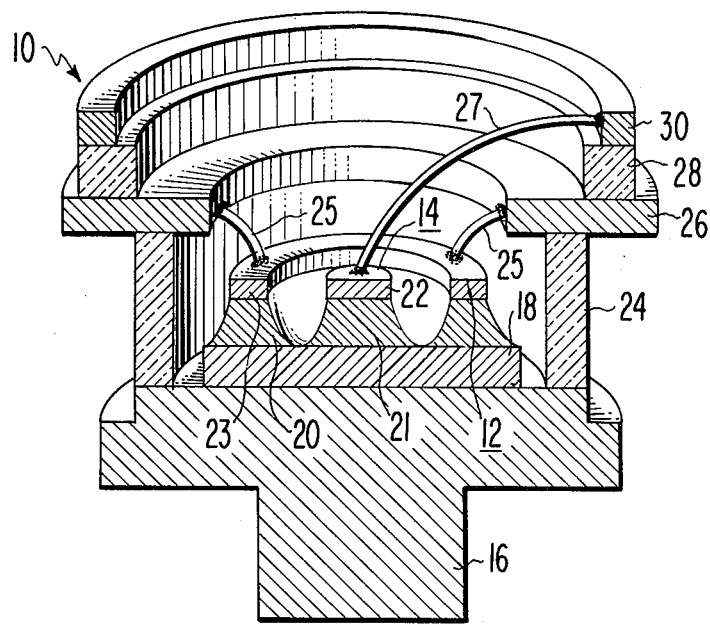
FIG. 1 is a cross-sectional perspective view of the constant temperature device of the present invention.

Referring to FIG. 1, a form of the constant temperature device is designated as 10. The constant temperature device 10 includes two transferred electron devices (TED's) designated 12 and 14, mounted on the heat sink ground terminal 16. Terminal 16 functions both as an electrical contact and a heat sink for TED's 12 and 14. Mounted on heat sink ground terminal 16 is an annular-shaped ceramic insulator 24 which in turn has annular-shaped contact 26 mounted on it. Contact 26 is the external electrical contact for TED 12 and is internally connected to TED 12 by connecting wire 25. Mounted on contact 26 is annular-shaped ceramic insulator 28 which has mounted on it contact 30. Contact 30 is the external electrical contact for TED 14 and is internally connected to TED 14 by connecting wire 27. Electrical contacts 26 and 30 along with insulators 24 and 28 will be referred to as the "housing" unit.

Transferred electron devices 12 and 14 are bodies of semiconductor material having a high mobility state which is low in energy and a low mobility state which is high in energy and which is capable of transferring electrons from said high mobility state to said low mobility state under the influence of an electric field, and resulting in an average electron velocity decrease. Such a phenomenon is known as the transferred electron effect. The Group III–V compound semiconductor materials, such as gallium arsenide have this characteristic. The transferred electron device 12 includes three conductivity regions 18, 20, and 23, and transferred electron device 14 includes three conductivity regions 18, 21 and 22. The center conductivity regions 20 and 21 are of N type conductivity and are the active regions of transferred electron devices 12 and 14. Regions 20 and 21 are of a moderate doping concentration, and in order to generate the transferred electron effect a certain relationship of device length, propagation velocity and ionized donor density must be maintained, which is well known in the art. Regions 18, 22 and 23 are of a high conductivity, preferably of N+ type conductivity, and function as electrical contacts for active regions 20 and 21, with region 18 being common to both TED's 12 and 14.

Transferred electron device 12 is annular in structure and surrounds TED 14, but for the common region 18. The TED 14 and annular-shaped TED 12 with common conductivity region 18, can be formed by etching out of a three layer wafer of semiconductor material, an annular-shaped portion two layers thick.

Although the embodiment of the present invention, as illustrated in FIG. 1, shows TED 12 surrounding TED 14, another embodiment may not have one TED surrounding the other as long as they are in close proximity. And while the embodiment of the present invention, as illustrated in FIG. 1, shows two TED's on the same side of the common conductivity region 18, the two TED's can be on opposite sides of a common conductivity region, or in any close relationship.

Figure 2:
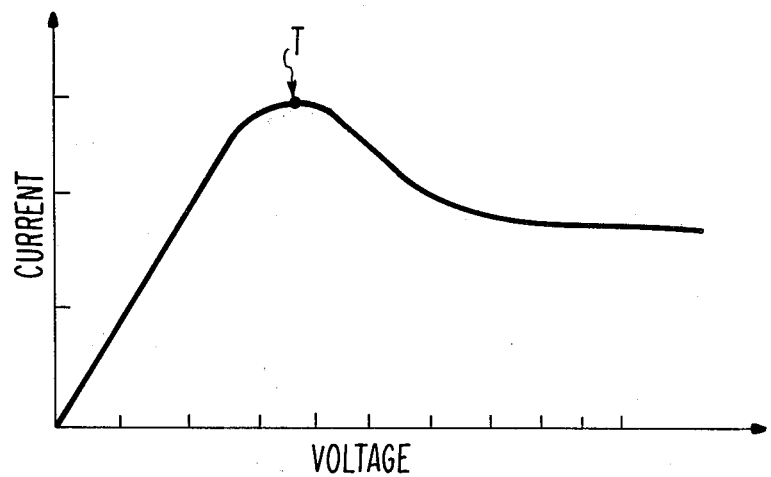
FIG. 2 is a graphical representation of the current-direct voltage characteristic of a transferred electron device.

The current-direct voltage characteristic of a TED is shown as FIG. 2. In FIG. 2 the voltage designated as T is known as the threshold voltage. Threshold voltage is determined by the particular semiconductor material, and is that voltage which must be surpassed in order for the TED to function in its normal microwave operation. The portion of FIG. 2 below the threshold voltage, T, is characterized by a linear relationship of current to direct voltage.

The transferred electron device 14 is electrically biased above threshold voltage so as to function in its normal microwave operation as an amplifier or oscillator. When in normal operation, TED 14 generates internal heat in its active regions 20 and 21, but the actual operating temperature of TED 14 includes both the self-induced temperature and the ambient or heat sink temperatures. Changes in ambient or heat sink temperatures cause difficulties in the normal operation of a TED.

In the present embodiment of the invention, decreases or increases in ambient or heat sink temperatures are negated by thermally coupling TED 14 to TED 12. Transferred electron device 12 is operated in the voltage range below the threshold voltage, T. Operation in the below-threshold-voltage range is characterized by a proportional change in current to variations in direct voltage; thus, as direct voltage is increased in the below-threshold-voltage range, the power dissipated in active region 20 increases and conversely decreases as the direct voltage is decreased. With the thermal coupling of TED 12, a third heat factor will influence the operating temperature of TED 14. Heat generated in region 20 is transferred to active region 21 of TED 14 by the common region 18. Therefore, if region 18 is of a semiconductor material of moderately good thermal conductivity, such as GaAs, any decrease or increase in ambient or heat sink temperatures are efficiently compensated by an increase or decrease in heat generated by TED 12. Transferred electron device 12 will be referred to as the "heater" device and TED 14 will be referred to as the "microwave" device.

Figure 3:
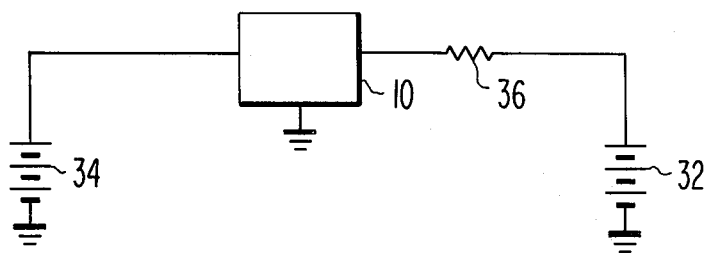
FIG. 3 is a schematic of a form of an external temperature sensing circuit.

External electrical circuitry may be used to sense ambient temperature changes and control current to the "heater" device to compensate for such temperature change. A form of such circuitry is diagramed in FIG. 3. Referring to FIG. 3, there is shown a current source 32 for "heater" device 12 and a current source 34 for "microwave" device 14. In the path of "heater" operating current, between current source 32 and constant temperature device 10, a temperaturesensing device 36, such as a thermistor, varies current the "heater" device 12 will receive in correspondence to the ambient temperature it senses. Preferably, temperature-sensing device 36 is in close proximity to the constant temperature device 10, for whose ambient temperature it must sense. FIG. 3 is one simple form of many possible temperature control circuits that can operate in conjunction with constant temperature device 10.

In addition, since the current in the "microwave" device 14 is a strong negative-going function of temperature, this current may also be used as the reference for any temperature control circuit with the further advantage of having the monitor point at the "microwave" device 14.

Figure 4:
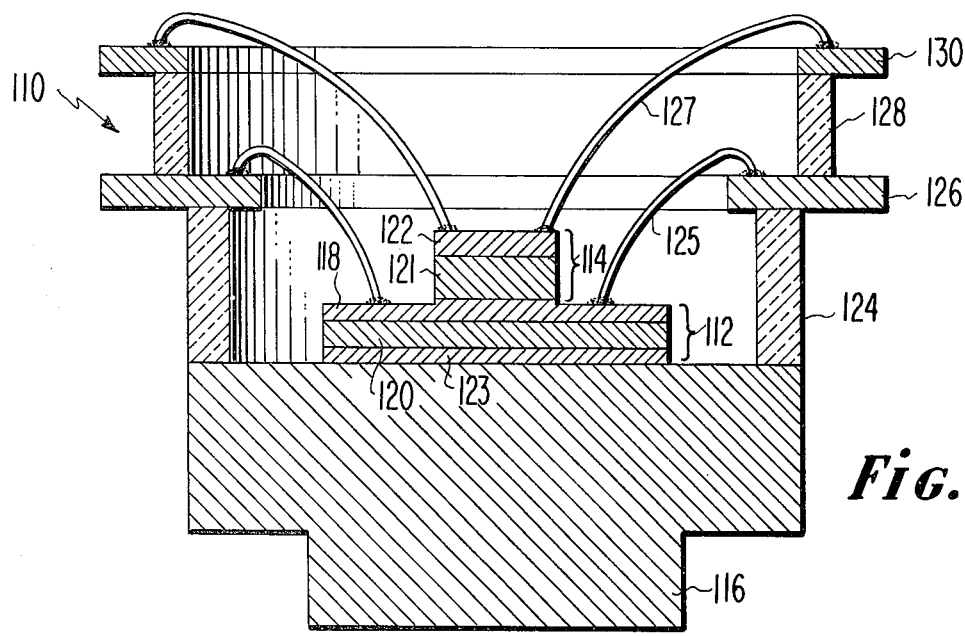
FIG. 4 is a cross-sectional view of a second embodiment of the constant temperature device.

Referring to FIG. 4, a second embodiment of the present invention is designated as 110. The constant temperature device 110 includes several parts exactly the same as those in the prior embodiment of the constant temperature device designated as 10 and shown in FIG. 1. The constant temperature device 110 includes two transferred electron devices designated as 112 and 114. Transferred electron device 112 is mounted on the heat sink ground terminal 116, and extending above TED 112 is TED 114. The heat sink ground terminal 116 is the same as heat sink ground terminal 16. Though the configuration of TED's 112 and 114 are different from those of TED's 12 and 14, they still function as a "heater" device and a "microwave" device, respectively. Constant temperature device 110 differs from device 10 in that "heater" device 112 is located between heat sink ground terminal 116 and "microwave" device 114.

Transferred electron devices 112 and 114 are epitaxially grown from a single crystalline material and each comprise three conductive regions designated 118, 120, 121, 122 and 123, but share a common conductivity region 118. Region 118, like region 18, is of a moderately high thermal conductivity so as to facilitate heat transfer from TED 112 to TED 114. Regions 122 and 123, like regions 22 and 23, are of high conductivity and function as electrical contacts, while regions 120 and 121, like regions 20 and 21, are the active regions.

Electrical contacts 126 and 130, along with insulators 124 and 128, comprise a "housing" unit, the same in function and structure as the "housing" unit referred to in constant temperature device 10. The connecting wire 125 electrically connects TED 112 to its external electrical contact 126, but in order for connecting wire 127 to electrically connect TED 114 to its external electrical contact, a portion of regions 121 and 122 of the "microwave" device 114 are etched away from the epitaxially grown single crystalline material.

Figure 5:
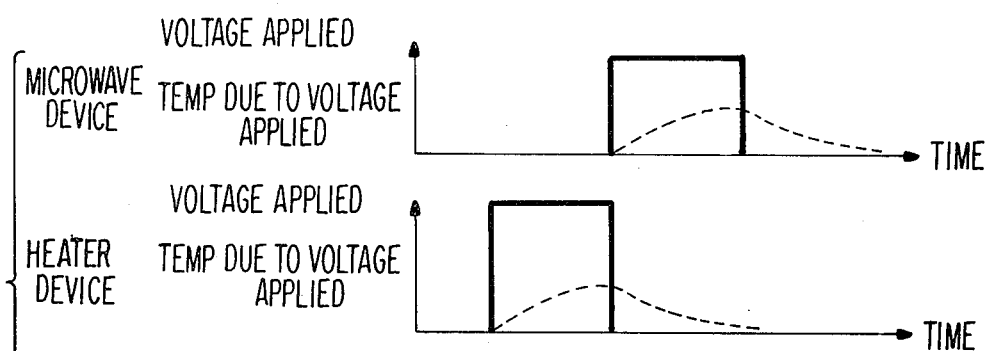
FIG. 5 is a graphical representation of net operating temperature in one mode of device operation.
Figure 6:
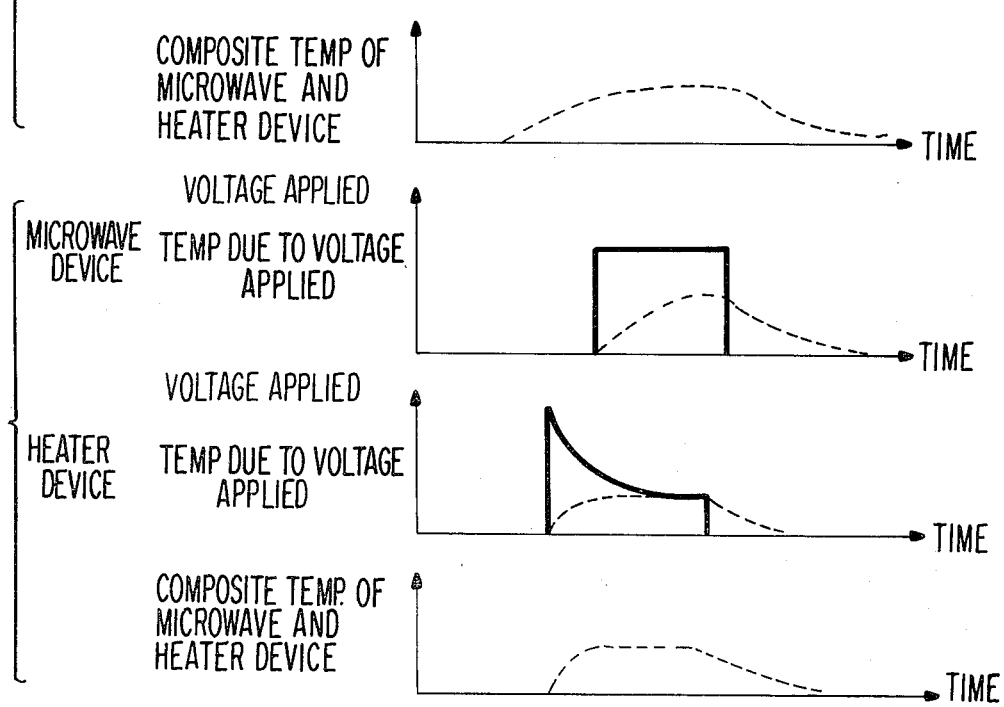
FIG. 6 is a graphical representation of net operating temperature in another mode of device operation.

This second embodiment of the present invention will compensate for rapid changes in temperatures, such as occur because of self-heating of the transferred electron device 114 by a pulse whose duration is of the order of microseconds. The rapid thermal response of the temperature at the "microwave" device 114 to heat input at the "heater" device 112 is the result of their close proximity, usually only a few microns. As an example, if the semiconductor material is GaAs, a heat pulse can travel the distance of 5 $\mu$m between "heater" device 112 and a point on "microwave" device 114 in approximately 1 $\mu$sec. Thus, in this second embodiment, the temperature of the "microwave" device 114 can be controlled rapidly by electrical input to "heater" device 112. At least two modes of temperature control are possible. One mode is illustrated in FIG. 5 wherein a voltage pulse to the "heater" device slightly precedes the voltage pulse to the "microwave" device, such that the "microwave" device is cooling down from the "heater" device pulse while heating up due to its own pulse. The net result, viewed in FIG. 5, is a relatively constant temperature throughout the duration of the "microwave" device pulse. A second mode of temperature control, shown in FIG. 6, requires that a shaped pulse to the "heater" device precede the voltage pulse to the "microwave" device with the net effect of a constant temperature throughout the duration of the "microwave" device pulse. Temperature is designated by dashed lines and voltage by solid lines in FIGS. 5 and 6.

Thus, there is provided by the present invention a device to reduce temperature-caused variations and instabilities in pulsed and continuous wave transferred electron oscillators and amplifiers.

We claim:

1. A constant temperature device comprising two transferred electron bulk semiconductor devices, said transferred electron devices each comprising a body of semiconductor material having a high mobility state which is low in energy and a low mobility state which is high in energy and which is capable of transferring electrons from said high mobility state to said low mobility state under the influence of an electric field above a threshold voltage and contacts at the opposite ends of the body, said transferred electron devices having thermally connected semiconductor material, means biasing one of said two transferred electron devices above the threshhold voltage of said one transferred electron device whereby said one transferred electron device exhibits a negative resistance and means biasing the other transferred electron device of said two transferred electron devices below said threshold voltage of said other transferred electron device whereby said other transferred electron device exhibits a positive resistance.

2. The constant temperature device in accordance with claim 1 in which said contacts are of a high electrical conductivity semiconductor material.

3. The constant temperature device in accordance with claim 2, in which the body of semiconductor material of the one transferred electron device and the body of semiconductor material of said other transferred electron device are on a common contact which thermally connects the devices.

4. The constant temperature device in accordance with claim 3, in which said body of semiconductor material of said one transferred electron device and said body of semiconductor material of said other transferred electron device are on the opposite sides of the common contact.

5. The constant temperature device in accordance with claim 3, in which said body of semiconductor material of said one transferred electron device and said body of semiconductor material of said other transferred electron device are on the same side of the common contact.

6. The constant temperature device in accordance with claim 5, in which said body of semiconductor material of said other transferred electron device biased below the threshold voltage surrounds said body of semiconductor material of said one transferred electron device biased above the threshold voltage.

7. The constant temperature device in accordance with claim 1, including a thermal sensor connected to the biasing means for said other transferred electron device and in close proximity to said constant temperature device to change the biasing voltage as the ambient temperature about the constant temperature device changes.

* * * * *